United States Patent [19]
Martens et al.

[11] Patent Number: 5,378,999
[45] Date of Patent: Jan. 3, 1995

[54] HYBRID MATRIX AMPLIFIER

[75] Inventors: Jon S. Martens, Sunnyvale, Calif.; Vincent M. Hietala, Placitas; Thomas A. Plut, Albuquerque, both of N. Mex.

[73] Assignee: The United States of America as represented by the U.S. Department of Energy, Washington, D.C.

[21] Appl. No.: 108,941

[22] Filed: Aug. 16, 1993

[51] Int. Cl.6 .......................... H03F 3/68; H03K 3/38
[52] U.S. Cl. ..................................... 330/295; 505/855; 327/528
[58] Field of Search ................. 307/306; 330/277, 286, 330/295, 307; 333/995; 505/855

[56] References Cited

U.S. PATENT DOCUMENTS

| | | | |
|---|---|---|---|
| 4,511,813 | 4/1985 | Pan | 330/277 X |
| 4,845,440 | 7/1989 | Aitchison | 330/277 |
| 5,019,721 | 5/1991 | Martens et al. | 307/306 |
| 5,055,798 | 10/1991 | Heinzelmann | 330/295 |

OTHER PUBLICATIONS

Niclas, Karl B., "The Matrix Amplifier: A High-Gain Module for Multioctave Frequency Bands," IEEE, vol. MTT-35, No. 3, pp. 296-306, 1987.

Schindler, Manfred J. et al., "A K/Ka-Band Distributed Power Amplifier with Capacitive Drain Coupling," IEEE, vol. 36, No. 12, pp. 1902-1907, 1988.

Moore, C. R., et al., "Cryogenic Performance of GaAs MMIC Distributed Amplifier," IEEE, vol. 39, No. 3, pp. 567-571, 1991.

Primary Examiner—Steven Mottola
Attorney, Agent, or Firm—Timothy D. Stanley; George H. Libman

[57] ABSTRACT

The present invention comprises a novel matrix amplifier. The matrix amplifier includes an active superconducting power divider (ASPD) having N output ports; N distributed amplifiers each operatively connected to one of the N output ports of the ASPD; and a power combiner having N input ports each operatively connected to one of the N distributed amplifiers. The distributed amplifier can included M stages of amplification by cascading superconducting active devices. The power combiner can include N active elements. The resulting (N×M) matrix amplifier can produce signals of high output power, large bandwidth, and low noise.

17 Claims, 6 Drawing Sheets

HYBRID MATRIX AMPLIFIER

The United States Government has rights in this invention pursuant to Contact No. DE-AC04-76DP00789 between the Department of Energy and American Telephone and Telegraph Company.

BACKGROUND OF THE INVENTION

The present invention relates generally to matrix amplifiers and more particularly to hybrid matrix amplifiers employing a unique combination of magnetic field and electric field controlled amplifiers.

Since the development of distributed amplifiers by Percival in British Patent 460,562, a variety of solid state circuitry schemas have recently been developed to implement this concept. Most notably, recent distributed amplifiers as described by Schindler et al in "A K/Ka-Band Distributed Power Amplifier with Capacitance Drain Coupling", IEEE Transactions on Microwave Theory and Techniques Vol. 36, No. 12, pp. 1902-1907 (1988) and Niclas et al in "The Matrix Amplifier: A High-Gain Module for Multi-octave Frequency Bands", IEEE Transactions MTT-35, No. 3, pp. 296-306 (1987) have both employed field effect transistors (FETs) as the active devices to achieve signal gain or amplification. The attractiveness of such distributed amplifiers resides in their ability to achieve moderate gain at high frequencies (e.g. GHz) over wide bandwidths (e.g. 10-30 GHz). Use of such distributed amplifiers for signal processing and communications applications can also require high efficiencies, low Noise Figures and reasonably high output power. However, present distributed amplifiers cannot maintain low Noise Figures, large bandwidth and high output power requirements simultaneously.

Amplification of a signal with two or more active devices can be classified as multiplicative or additive. In the former case, the overall gain is proportional to the product of the gains of each active device, while in the latter case, gain is proportional to the sum of the gains from each active device. The vast majority of amplifiers make use of the multiplicative process. The most notable exception is the distributed amplifier, described above, whose amplifying mechanism is based on the additive concept. While amplifiers which employ the multiplicative concept can yield greater gain, they tend to be band width limited as well as noisier.

More recently, Niclas et al described (N×M) matrix amplifiers which combined active devices employing both the multiplicative and additive concepts in a single circuit. Its purpose was to enhance the characteristics features of both devices (i.e. increase the gain of additive devices and increase the bandwidth of multiplicative devices). Niclas' circuit consisted of an array of N rows of distributed amplifiers and M columns or stages of cascaded active devices in each distributed amplifier wherein each active device in a row is further linked to a corresponding active device in adjacent rows of distributed amplifiers. The active devices of Niclas' circuit are all FETs.

In spite of such advances, a need still exists for matrix amplifiers having a low Noise Figure for amplifying signals of very low amplitude (e.g. of the order of $\mu A$ or mV) which cannot be adequately satisfied by existing matrix amplifiers. In particular, each row of distributed amplifiers in existing matrix amplifiers is limited to no more than ~6-10 cascaded FET devices because the gate resistance of the FETs can cause the input signal to be greatly attenuated. The present invention is not limited in the number of active devices which can be employed in each row of cascaded devices in the distribute amplifier. Consequently, the present invention can have greater gain. Moreover, since the matrix amplifier of the present invention includes superconducting active devices having very low Noise Factors, it is capable of processing very low amplitude signals as well as yielding a much broader bandwidth (e.g. >50 GHz).

SUMMARY OF THE INVENTION

The present invention comprises a novel hybrid matrix amplifier containing both magnetic and electric field controlled devices. In one embodiment of the present invention, a divider circuit divides an input signal S into N amplified signals $S_n$. Each of the N amplified signals $S_n$ is communicated to one of N distributed amplifier circuits resulting in N further amplified signals $\sigma_n$. The N further amplified signals $\sigma_n$ are communicated to a combiner circuit to produce a combined output signal $\Sigma$. The divider circuit can include N active flux flow devices for dividing and amplifying the input signal S. Preferably, such flux flow devices comprise superconducting flux flow transistors (SFFTs). Advantageously, the N distributed amplifiers each comprise cascaded flux flow devices for further amplify each of the N divided input signals $S_n$, yet minimizing noise added to the amplified signals $\sigma_n$. The combiner circuit includes a distributed amplifier composed of N FET devices to further enhance the amplification and output power in the combined output signal $\Sigma$. These and other features of the present invention will be described in more detail below in conjunction with the attached drawings.

DETAILED DESCRIPTION OF THE INVENTION

In order to better understand the present invention, the following introductory comments are provided.

Superconducting flux flow transistors (SFFT) are a relatively recently developed active four terminal superconducting device. As used herein, an active device is one producing a gain >1; whereas a passive device is one producing a gain ≦1. The SFFT device can exhibit high speed operation (10-30 ps transit times with 3 $\mu m$ minimum feature size), large gain (8 dB) low Noise Figures (2-3 dB) and output impedance levels suitable for many applications. The operation of SFFTs is based on magnetic control of flux flow in an array of high temperature superconducting weak links, unlike field effect transistor (FET) devices which depend on an electric field for control.

Figure 1:
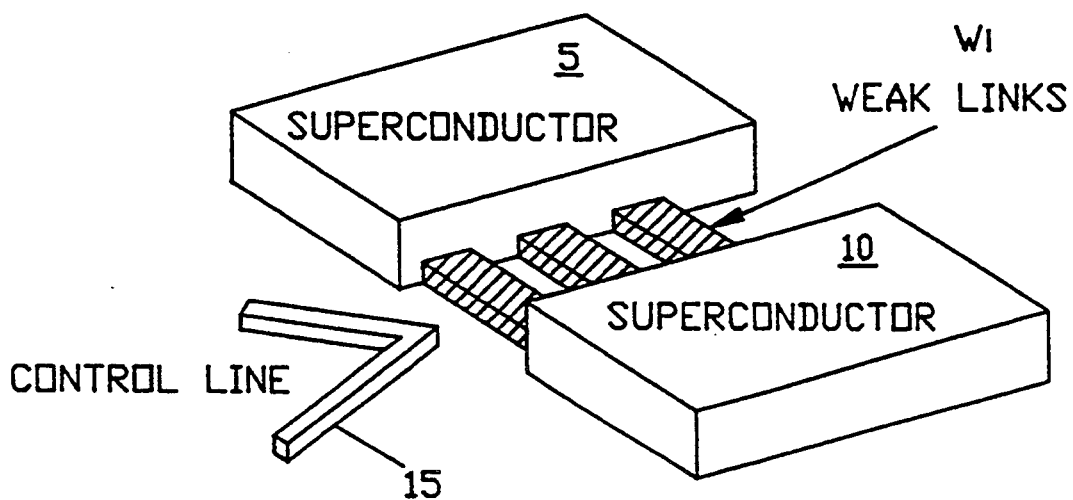
FIG. 1 depicts the structure of a superconducting flux flow transistor (SFFT).

A typical SFFT device consists of a parallel array of weak superconducting links $W_i$ connecting two unweakened superconducting electrodes 5, 10 and a superconducting control line 15 near the links $W_i$ to provide a local magnetic field. An example of this structure is shown in FIG. 1. The weak links $W_i$ are typically 2-3 μm wide by 10 μm long, separated by 6 μm and 50-90 nm thick. The superconducting electrodes 5, 10 are at least 200 nm thick. The localized thickness reduction of the weak links $W_i$ is important to allow flux flow in a well defined path. This maximizes flux speed and keeps the voltage levels reasonable (1-100 mV in normal operation). The number of weak links does not strongly affect SFFT device performance but the larger the number of weak links can help by lowering output resistance and slightly increasing device gain at the expense of frequency response.

When a SFFT device is biased below the critical current of the weak link, (typically 0.1-10.0 mA), no flux is admitted into the weak link. Above the critical current, flux is admitted in discrete quanta known as vortices. The vortices can move due to the Lorentz force generated by the bias current. Other forces affecting the vortex motion are pinning, effective viscosity of the superconductor, external magnetic fields from the control line or parasitic sources, and surface barriers that hamper the motion of flux into and out of the links. Many of these forces are functions of the superconductor quality and thus emphasize the importance of good film growth. The balance of all of these forces determines the flux motion and hence the terminal voltage via Faraday's law.

In terms of SFFT device operation, the external magnetic field developed by the control line (resulting from an input signal) modulates the flux density and flux motion in the weak link and consequently the resulting output characteristics of the SFFT device. SFFT devices can be made from HTS films of TlCaBaCuO or YBaCuO on LaAlO$_3$ substrates. However, those skilled in the art will appreciate that the SFFT devices of the present invention are not limited to these films or substrates. For example, substrates such as YSZ have also been used as well as HTS materials such as BiSrCaCuO and low temperature superconducting (LTS) materials including Nb, Nb$_3$SN and NbN. The SFFT devices and associated circuitry can be formed with standard optical lithography.

Figure 2:
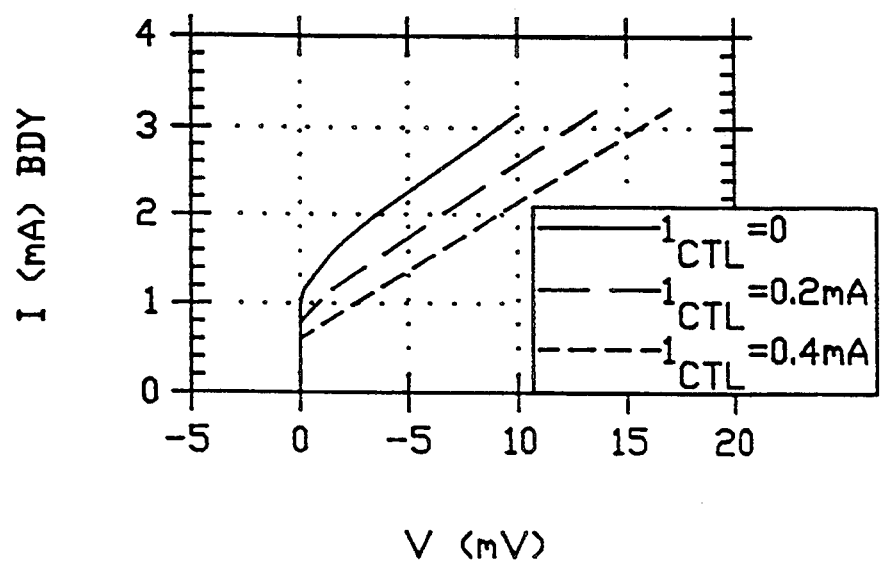
FIG. 2 depicts I-V relationship for a variety control currents $I_{ctl}$ in the SFFT of FIG. 1.

I-V curves a of SFFT devices for a variety of control currents are shown in FIG. 2. The current through the weak link (or body) is denoted by $I_{bdy}$ while the control current (i.e. the input signal) is labeled $I_{ctl}$. The voltage across the body terminals is V. The two most important circuit parameters to be obtained from these curves are the transresistance ($r_m = \delta V/\delta I_{ctl}$) and output resistance ($r_o = \delta V/\delta I_{bdy}$). For microwave measurements, SFFT devices can be biased $I_{bdy} = 8$ mA and $I_{ctl} = 0.2$ mA where typical values are $r_m \sim 17$-$19$ $\Omega$ and $r_o \sim 3$-$4\Omega$.

Figure 3:
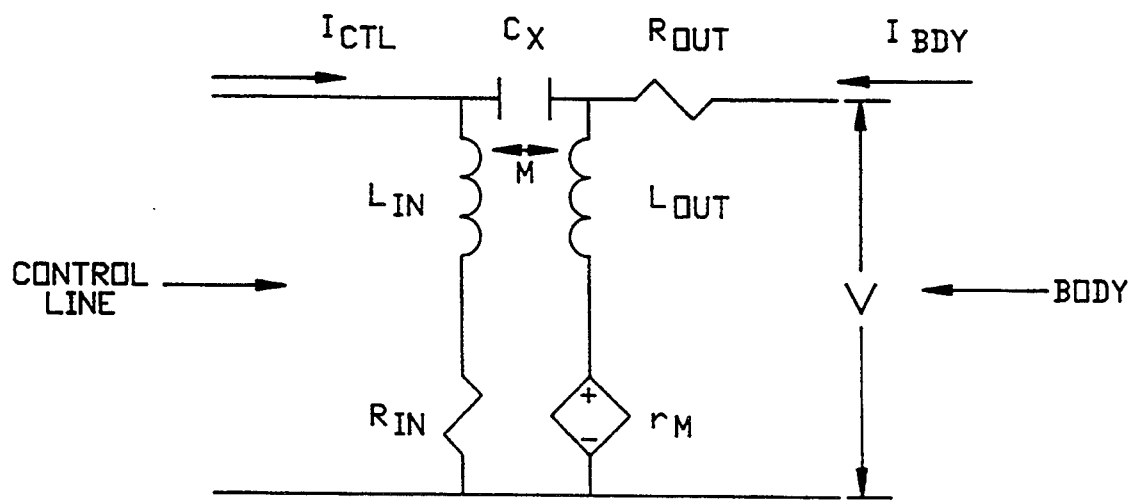
FIG. 3 depicts the equivalent circuit to the SFFT of FIG. 1.

An equivalent circuit to the device depicted in FIG. 2 based on device physics is shown in FIG. 3. Since the moving magnet flux M generates a voltage V and the control variable is a current, a transresistance $r_m$ is the active element for the equivalent circuit. The moving vortices can be represented as ohmic resistance ($r_o$). The input and output impedances $L_{in}$, $L_{out}$ are both inductive because of the geometry of the structures and, for the output inductance, because of the excess kinetic inductance of the thin superconducting film in the weak link region. Since the output inductance and output resistance are affected by the number of vortices in the weak links, these two parameters will be functions of bias. Alternative superconducting flux flow devices can also include magnetically controlled long junctions (e.g. Josephson Junctions).

Single distributed amplifiers have been made with a variety of devices; however, the output power has never been very high with superconducting devices. Among distributed amplifier structures using superconducting devices, those using SFFTs have advantages in power handling and efficiency. With FETs and other conventional devices in the distributed amplifier structure, enough devices cannot be used (because of resistive parasitics) to allow large gain or sufficiently low Noise Figures.

Superconducting flux flow devices in general and SFFT devices in particular are ideal for use in distributed amplifiers because of their characteristics. A schematic of a distributed amplifier using SFFT devices is pictured in FIG. 4. As with all distributed amplifiers, the principle is to embed a plurality of SFFT devices $F_m$ in a pair of artificial transmission lines 30, 35. As an input signal S propagates down the input transmission line 30, it sequentially excites each SFFT device $F_m$ at control points $P_m$ and thus produces an amplified copy of the input signal $S_n$ on the transmission line 35. If the propogation velocities of the two transmission lines are matched by matching transmission line impedances, the amplified copies of the signal $S_n$ produced by each SFFT device $F_m$ will add coherently along the output transmission line 35 resulting in an output amplified signal $\sigma$. Since the SFFT device parasitics are embedded in the transmission lines, bandwidth can be much larger.

The use of field effect transistors (FET) in distributed amplifiers is also common; however, the FET is not as well suited to distributed amplifier use because of its relatively large feedback (resulting in distortion and instabilities) and gate (input) losses which limit the number of FET devices that can be used before the noise levels become very large. The FET version does, however, have an advantage of larger output power.

The hybrid matrix amplifier of the present invention combines the output power advantages of FET devices in a distributed amplifier structure with the noise, speed and signal purity advantages that SFFT devices in a distributed amplifier structure can offer. In particular, a plurality of SFFT distributed amplifiers can be used at the input of the hybrid matrix amplifier where their low noise and high speed advantages are exploited. The outputs of the SFFT distributed amplifiers can then be multiplexed through a FET distributed amplifier structure to achieve enhanced output power levels.

Figure 5:
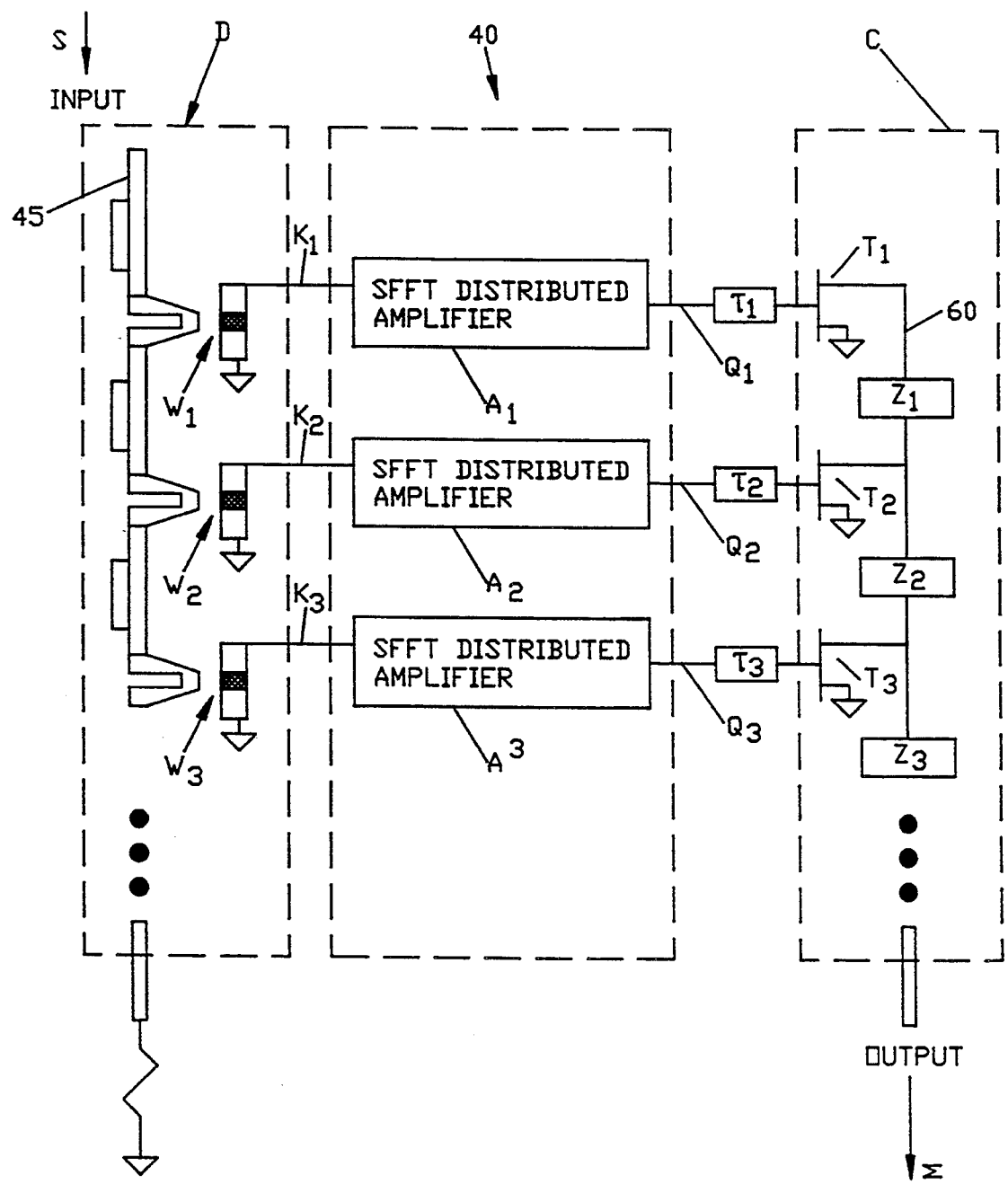
FIG. 5 depicts a hybrid matrix amplifier according to the present invention.

Looking now to FIG. 5, a hybrid (N×M) matrix amplifier according to the present is depicted. Generally, the hybrid matrix amplifier 40 comprises: a divider circuit D having N output ports $K_n$ (where $N \geq 1$); a plurality of distributed amplifiers $A_n$ each operatively connected to one of the output ports $K_n$ of the divider circuit D so as to receive an amplified and divided input signal $S_n$; and a combiner C circuit having N input ports $Q_n$ each operatively connected to one of the distributed amplifiers $A_n$ so as to combine the amplified output signal $\sigma_n$ of each distributed amplifier $A_n$ and produce an output signal $\Sigma$.

The divider circuit D includes an input transmission line 45 for receiving an input signal S and N superconducting weak link devices $W_n$. In particular, each weak link device $W_n$ is an active SFFT device, the output of the divider D is N amplified input signals S, i.e. $S_n$. Each of the N output ports $K_n$ of the divider circuit D are operatively connected to one of the distributed amplifiers $A_n$ as an input transmission line.

Figure 4:
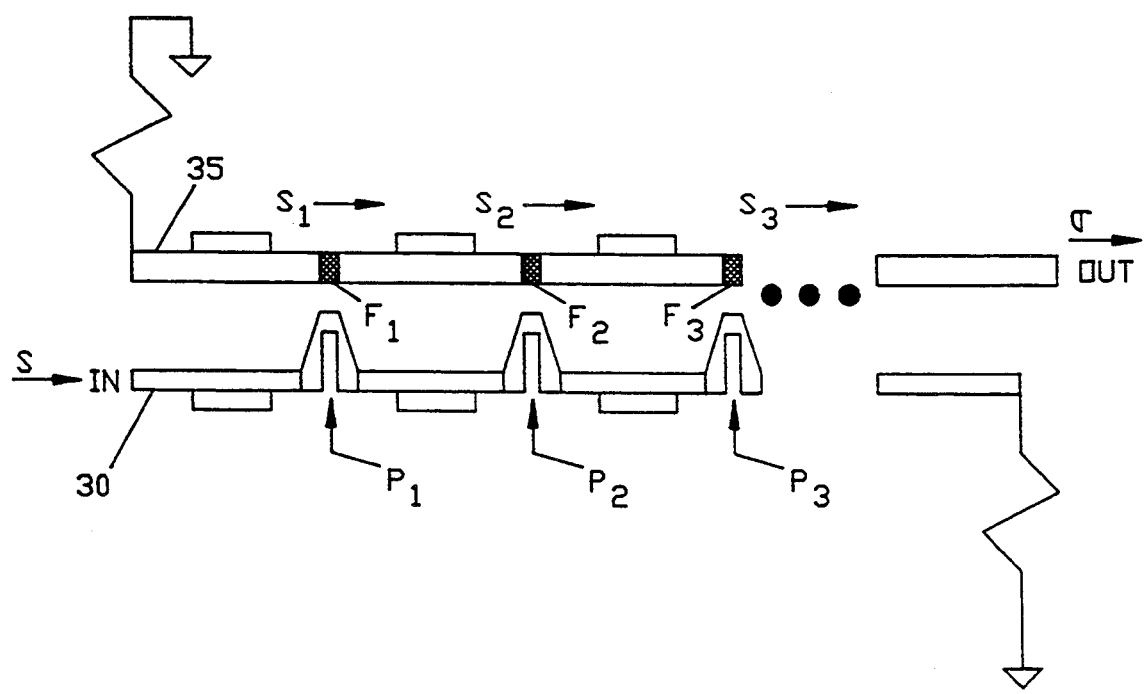
FIG. 4 depicts a distributed amplifier having a plurality of cascaded SFFTs.

Each of the N distributed amplifiers $A_n$ comprises a cascaded arrangement of active devices $F_m$ having a common input transmission line 30 and output transmission line 35 as depicted in FIG. 4. The input transmission line 30 of each distributed amplifier $A_n$ is operatively connected to one of the output ports $K_n$ of the divider circuit D so as to have the amplified and divided signal $S_n$ act as input signal to the distributed amplifier $A_n$. Preferably, the active devices $F_m$ each comprise a superconducting flux flow device such as a SFFT or Josephson Junction.

The combiner circuit C comprises a distributed amplifier composed of N FET devices $T_n$ wherein the input port $Q_n$ to each FET $T_n$ is operatively connected to the output transmission line of one of the SFFT distributed amplifiers $A_n$. Each input port $Q_n$ line from a distributed amplifier $A_n$ can also include a time delay device $\tau_n$ to ensure that the output signal $\sigma_n$ of each SFFT distributed amplifier $A_n$ is appropriately phased with the other output signals $\sigma_n$ for proper operation of the combiner circuit C. The output transmission line 60 of the combiner circuit C can also include impedance matching elements $Z_n$ to ensure that the output signals of each FET $T_n$ add constructively to produce output signal $\Sigma$. The use of the distributed power combiner with integrated delay equalization and matching is instrumental in maintaining the higher gain, higher efficiency, and lower Noise Figures that SFFT distributed amplifiers can provide.

A first embodiment of the hybrid (N×M) matrix amplifier of the present invention comprises an (8×13) matrix amplifier array of SFFTs. As used herein, N refers to the number of rows of distributed amplifiers and M refers to the number of active SFFT devices in each row of distributed amplifiers. The actual number of SFFT devices is fairly arbitrary although performance can be affected. A divider SFFT circuit is used to parse an input signal S to each of the eight SFFT distributed amplifiers. Each distributed amplifier includes 13 SFFT devices. The outputs of each SFFT distributed amplifier are coupled into a power combiner composed of eight FETs. Additional lengths of transmission line can be used before the power combining to compensate for the timing stagger between stages on the input and output amplifiers.

Figure 6:
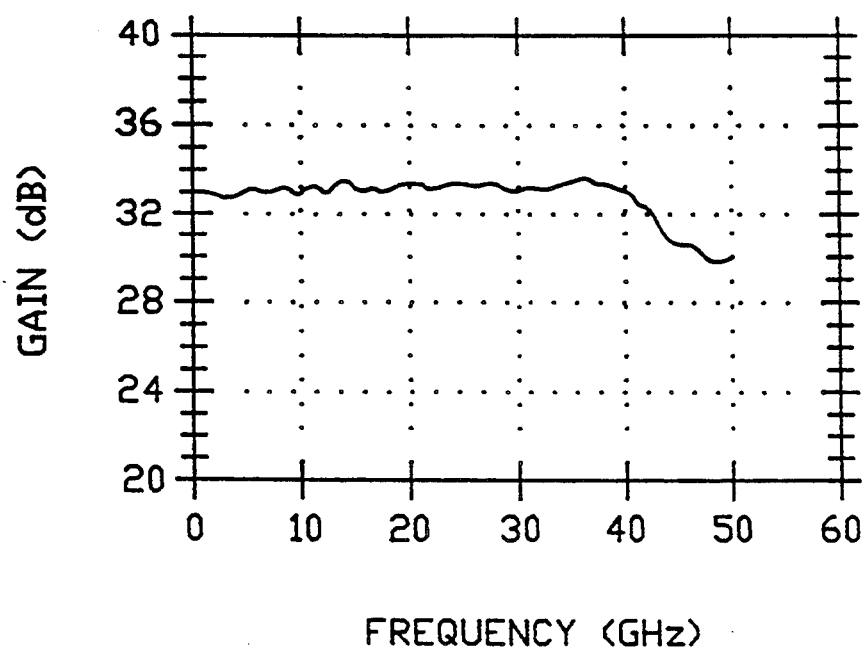
FIG. 6 depicts amplification as a function of frequency for one embodiment of the present invention.

The performance of such matrix amplifier is illustrated in FIG. 6. This circuit was implemented on several substrates and the circuit can be fabricated this way or quasi-monolithically. The SFFT segment of the matrix amplifier consumed about 15 mW of DC power while the FET segment consumed 200–400 mW. The maximum output power was ~100 mW and system efficiencies were around 20% in this embodiment. Bandwidth exceeded 40 GHz and was limited by the non-optimal FET stages. The Noise Figure was only measured at 10 GHz and was ~3 dB which is extremely low for an amplifier of this bandwidth. Gain of over 30 dB was available across the band as illustrated in the FIG. 6.

The present invention has been described in detail including one embodiment; however, those skilled in the art will recognize that alternative configurations of magnetic and electric field controlled active devices as well as alternative flux flow devices can be employed without departing from the scope of the claim attached herewith.

We claim:
1. A matrix amplifier for amplifying an input signal S, comprising:
   a) an active superconducting divider circuit having an input port for receiving an input signal S and N output ports for dividing the input signal S into N separate signals $S_n$, where $N \geq 1$;
   b) N distributed amplifiers each operatively connected to a respective output port of the superconducting divider circuit for receiving and amplifying the signal $S_n$ and producing an amplified signal $\sigma_n$; and
   c) a combiner circuit having N input ports and an output port, wherein each input port is operatively connected to one of the distributed amplifiers for receiving and combining the amplified signals $\sigma_n$ of each distributed amplifier and producing an output signal $\Sigma$.

2. The matrix amplifier of claim 1, wherein the superconducting divider circuit comprises N superconducting flux flow transistors (SFFTs).

3. The matrix amplifier of claim 1, wherein each distributed amplifier comprises at least M stages of amplification, where $M \geq 2$.

4. The matrix amplifier of claim 1, wherein each distributed amplifier comprises at least M cascaded super conducting flux flow devices, where $M \geq 2$.

5. The matrix amplifier of claim 4, wherein the superconducting flux flow devices comprise superconducting flux flow transistors.

6. The matrix amplifier of claim 4, wherein the superconducting flux flow devices comprise Josephson Junctions.

7. The matrix amplifier of claim 1, wherein the combiner circuit comprises N field effect transistors (FETs).

8. The matrix amplifier of claim 7, wherein the FETs are arranged in a distributed amplifier structure.

9. The matrix amplifier of claim 1, further including a time delay element operatively connected between the output of each distributed amplifier and one of the input ports of the combiner circuit.

10. A hybrid matrix amplifier, comprising:
   a) a superconducting weak link device for dividing and amplifying an input signal S and producing N output signals $S_n$, where $N \geq 1$;
   b) N superconducting distributed amplifier means each operatively connected to receive one of the output signals $S_n$ and to produce an amplified signal $\sigma_n$; and
   c) combiner means operatively connected to receive the amplified signals $\sigma_n$, and combine them to produce an output signal $\Sigma$.

11. The matrix amplifier of claim 10, wherein the superconducting weak link device can be selected from the group consisting of SFFTs and Josephson Junctions.

12. The matrix amplifier of claim 10, wherein said superconducting distributed amplifier means comprises a cascade arrangement of superconducting weak link devices.

13. The matrix amplifier of claim 10, wherein said combiner means comprises a passive device.

14. The matrix amplifier of claim 10, wherein said combiner means comprises an active device.

15. The matrix amplifier of claim 14, wherein the active device is a field effect transistor (FET).

16. The matrix amplifier of claim 10, wherein said combiner means comprises N FETs in a distributed amplifier structure.

17. A hybrid (N×M) matrix amplifier, comprising:
   a) an array of N flux flow distributed amplifiers, wherein each flux flow distributed amplifier has an input port and output port and each flux flow distributed amplifier comprises M cascaded superconducting devices, wherein $N \geq 1$ and $M \geq 2$;
   b) a combiner device comprising N active devices, wherein each active device is operatively connected to one of the output ports of the N flux flow distributed amplifiers; and,
   c) a divider device comprising N superconductive flux flow devices each operationally connected to one of the input ports of the N flux flow distributed amplifiers.

* * * * *